United States Patent [19]
Miyazaki et al.

[11] Patent Number: 5,674,624
[45] Date of Patent: Oct. 7, 1997

[54] HIGHLY LIGHT-TRANSMITTING DUST PROTECTIVE FILM, AND DUST PROTECTIVE MEMBER

[75] Inventors: Tetsuya Miyazaki; Mayumi Kawasaki; Takao Ohno, all of Sodegaura, Japan

[73] Assignee: Mitsui Petrochemical Industries, Ltd., Tokyo, Japan

[21] Appl. No.: 168,196

[22] Filed: Dec. 17, 1993

Related U.S. Application Data

[62] Division of Ser. No. 777,130, Oct. 16, 1991, abandoned.

[30] Foreign Application Priority Data

Oct. 16, 1990 [JP] Japan ..................... 2-277113

[51] Int. Cl.$^6$ ................ B32B 9/04; B32B 27/06; G03F 9/00
[52] U.S. Cl. ................ 428/422; 106/287.14; 252/315.2; 252/384; 428/447; 430/5; 501/12
[58] Field of Search .................... 252/315.01, 315.1, 252/315.2, 315.6, 315.7, 384, 385; 106/287.14, 287.34; 501/12; 528/10, 12, 20; 428/421, 14, 447, 422; 430/5

[56] References Cited

U.S. PATENT DOCUMENTS

| | | | |
|---|---|---|---|
| 2,347,733 | 5/1944 | Christensen | 106/287.16 |
| 3,847,583 | 11/1974 | Dislich et al. | 501/12 X |
| 4,024,306 | 5/1977 | Takamizawa et al. | 427/387 |
| 4,028,085 | 6/1977 | Thomas | 501/12 X |
| 4,170,690 | 10/1979 | Armbruster et al. | 428/447 |
| 4,186,026 | 1/1980 | Rotenberg et al. | 106/287.14 |
| 4,282,314 | 8/1981 | Dinella et al. | 430/5 X |
| 4,397,666 | 8/1983 | Mishima et al. | 501/12 X |
| 4,614,673 | 9/1986 | Bendig | 427/376.2 |
| 4,680,046 | 7/1987 | Matsuo et al. | 501/12 X |
| 4,687,707 | 8/1987 | Matsuo et al. | 428/448 X |
| 4,816,072 | 3/1989 | Harley et al. | 501/12 X |
| 4,929,278 | 5/1990 | Ashley et al. | 106/287.12 |
| 4,966,812 | 10/1990 | Ashley et al. | 428/447 X |
| 4,996,106 | 2/1991 | Nakagawa et al. | 428/343 |
| 5,061,024 | 10/1991 | Keys | 359/350 |
| 5,204,381 | 4/1993 | Zeigler | 528/10 X |

FOREIGN PATENT DOCUMENTS 0303298  12/1988  European Pat. Off.

OTHER PUBLICATIONS

Derwent Accession No. 90–236–789, Questel Telesystems (WPIL), Derwent Publ. Ltd., London. (1990).
Derwent Accession No. 86–078 118, Questel Telesystems (WPIL), Derwent Publ. Ltd., London. (1986).
Patent Abstracts of Japan, unexamined applications, P field, vol. 12, No. 178, May 26, 1988, The Patent Office Japanese Government.
Derwent Accession No. 89–273–936, Questel Telesystems (WPIL), Derwent Publ. Ltd., London. (1989).

*Primary Examiner*—Richard D. Lovering
*Attorney, Agent, or Firm*—Sherman and Shalloway

[57] ABSTRACT

Disclosed is a highly light-transmitting dust protective film composed of at least one member selected from the group consisting of transparent gels of oxides, hydroxides, organic group-containing oxides and organic group-containing hydroxides of polyvalent metals, formed by the sol-gel process.

6 Claims, 5 Drawing Sheets

HIGHLY LIGHT-TRANSMITTING DUST PROTECTIVE FILM, AND DUST PROTECTIVE MEMBER

Thus is a division of application Ser. No. 07/777,130 filed Oct. 16, 1991, now abandoned.

BACKGROUND OF THE INVENTION (1) Field of the Invention

The present invention relates to a dust protective pellicle film for use in preventing adhesion of foreign substances such as dust to a photomask, a reticule or the like used at the photolithographic step in the production of a semiconductor element such as IC or LSI (hereinafter referred to as "mask or the like"), a process for the preparation of this pellicle film, and a dust protective member.

(2) Description of the Related Art

At the photolithographic step, a mask or the like comprising a circuit pattern composed of a vacuum deposition film of chromium, formed on the surface of a glass sheet, is used and an operation of transferring this circuit pattern onto a resist-coated silicon wafer is carried out. If at this step the light exposure is performed in a state where a foreign substance such as dust adheres to a circuit pattern on the mask or the like, also the foreign substance is transferred on the wafer and a defective product is formed. Especially, when the light exposure is effected by a stepper, the risk that all of chips formed on the wafer will become defective increases. Accordingly, adhesion of a foreign substance to a circuit pattern of a mask or the like is a serious problem. As the means for coping with this problem, there has recently been proposed a dust protective member (pellicle) comprising transparent light-transmitting dust protective films (pellicle films) arranged at appropriate intervals on one or both of surfaces of a mask substrate of a mask or the like.

Generally, this dust protective member comprises a holding frame composed of aluminum and a transparent light-transmitting dust protective film of an organic substance such as nitrocellulose spread on one side face of the holding frame, and a double-adhesive tape is bonded to the other side face of the holding frame so that the dust protective member can be attached onto a mask substrate of a mask or the like. Intrusion of a foreign substance from the outside can be prevented by this dust protective member, and even if a foreign substance adheres to the film, the foreign substance is not transferred onto the wafer, and the yield is increased at the production of semiconductor elements.

With recent increase of the integration degree in a semiconductor elements, rays for the light exposure have been shifted to the short wavelength side, from g rays (436 nm) to i rays (365 nm) and further to excimer laser rays (248 nm). In the conventional light-transmitting dust protective film composed solely of an organic substance such as nitrocellulose, the bonding state of molecules is weak and photodisintegration is caused in the film, with the result that the film per se becomes opaque and the mechanical strength of the film is degraded. Therefore, the conventional film cannot be used practically satisfactorily.

As the means for overcoming this problem, there has been proposed a light-transmitting dust protective film composed of an inorganic substance, such as synthetic silica glass, fused silica glass fluorite, in which the bonding of molecules is strong and photodisintegration is hardly caused (see Japanese Unexamined Patent Publication No. 62-288842 and Japanese Unexamined Patent Publication No. 63-6553). In the case where a film is formed from an inorganic substance as mentioned above, since the film has no pliability, formation of a single-layer film is difficult, as compared with the case where the film is formed from an organic substance.

SUMMARY OF THE INVENTION

It is primary object of the present invention to solve the foregoing problems and provide a highly light-transmitting dust protective film which has a good pliability and a high light transmission and does not undergo photodisintegration even when irradiated with not only g rays and i rays but also excimer laser rays and other short wavelength rays for a long time.

Another object of the present invention is to provide a process for preparing a highly light-transmitting dust protective film having the above-mentioned excellent properties very simply in a short time.

Still another object of the present invention to provide a dust protective member comprising a highly light-transmitting dust protective film having the above-mentioned excellent properties.

In accordance with the present invention, there is provided a highly light-transmitting dust protective film composed of at least one member selected from the group consisting of transparent gels of oxides, hydroxides, organic group-containing oxides and organic group-containing hydroxides of polyvalent metals, formed by the sol-gel process.

Preferably, the polyvalent metal is at least one member selected from the group consisting of silicon, aluminum, titanium and zirconium.

In the present invention, (1) the polyvalent metal oxide is a compound having, in at least a part of the molecule, Y—O bonds in the same number as the valency of Y, that is, $Y-(O)_k-$ (k is the valency of Y) per atom of the polyvalent metal (Y).

(2) The polyvalent metal (Y) hydroxide is a compound having, in at least a part of the molecule, Y-OH bonds (Y is the polyvalent metal).

(3) The organic group-containing polyvalent metal oxide is a compound having, in at least a part of the molecule, Y—O bonds in the same number as the valency of the polyvalent metal, that is, $Y-(O)_k-$ (k is the valency of Y), and an organic group per atom of the polyvalent metal Y.

(4) The organic group-containing polyvalent metal hydroxide is a compound having, in at least a part of the molecule, an organic group and Y—OH bonds (Y is the polyvalent metal).

In the compounds (3) and (4), as the organic group, there can be mentioned, for example, alkoxide groups, carboxylate groups and groups R exemplified hereinafter.

As the starting compound used for the sol-gel process, there can be mentioned hydrolyzable organic compounds (such as alkoxides and carboxylates or oligomers and polymers obtained by hydrolysis thereof) of said polyvalent metals and hydrolyzable inorganic compounds such as nitrate, chloride, oxide and hydroxide of said polyvalent metals. An oxide and/or hydroxide of said polyvalent metals which used as the starting compound are/is used in the form of fine particles.

As the starting compound especially preferably used in the present invention, there can be mentioned (i) a compound represented by the following formula:

$$Y-R^1_k \qquad (1)$$

wherein Y represents a metal atom selected from the group consisting of silicon, aluminum, titanium and zirconium, $R^1$ represents a hydrolyzable monovalent group, and k is the valency of the metal atom, (ii) a compound represented by the following formula:

$$R_n\text{—}Y\text{—}R^1{}_{k-n} \quad (2)$$

wherein R represents a monovalent hydrocarbon group or substituted hydrocarbon group, n is a number of from 1 to k−1, and Y, $R^1$ and k are as defined above, (iii) an oligomer or polymer obtained by hydrolysis bonding of the compound (i) and/or the compound (ii), (iv) a compound (nitrate) represented by the following formula:

$$Y(NO_3)_k \quad (3)$$

wherein Y and k are as defined above, (v) a compound (chloride) represented by the following formula:

$$Y(Cl)_k \quad (4)$$

wherein Y and k are as defined above, (vi) a fine particulate compound (oxide) represented by the following formula:

$$Y(O)_{k/2} \quad (5)$$

wherein Y and k are as defined above, (vii) a fine particulate compound (hydroxide) represented by the following formula:

$$Y(OH)_{k/2} \quad (6)$$

wherein Y and k are as defined above, and (viii) a combination of two or more of the above-compounds (i) to (vi).

This film can be singly used as the dust protective film, but the film can also be used in the form of a laminate dust protective film with a known antireflection film, especially an antireflection film composed of a perfluoro amorphous fluorine resin.

The above-mentioned film can be integrated with a holding body and the integrated body can be applied as the dust protective member.

In accordance with another preferred embodiment of the present invention, there is provided a process for the preparation of a highly light-transmitting dust protective film, which comprises forming a sol liquid by at least partially hydrolyzing said compounds (i)–(vii) and converting the sol liquid to a gel film at a temperature ranging from room temperature to 500° C.

BRIEF DESCRIPTION OF THE DRAWINGS

FIGS. 2A to 2C are sectional views showing several examples of the highly light-transmitting dust protective film of the present invention, in which FIGS 2A shows a film composed solely of a gel film, FIGS 2B shows a film comprising a gel film and a single antireflection layer, and FIG 2C shows a film comprising a gel film and a composite antireflection layer including a high refractive index layer and a low refractive index layer.

In FIGS. 1 and FIGS. 2A to 2C reference numeral 1 represents a dust protective member, reference numeral 2 represents a holding frame, reference numeral 3 represents a highly light-transmitting dust protective film, reference numeral 5 represents a mask substrate, reference numeral 6 represents a gel film, reference numeral 7 represents an antireflection layer, reference numeral 7a represents a high refractive index layer, and reference numeral 7b represents a low refractive index layer.

DETAILED DESCRIPTION OF THE PREFERRED EMBODIMENTS

Figure 1:
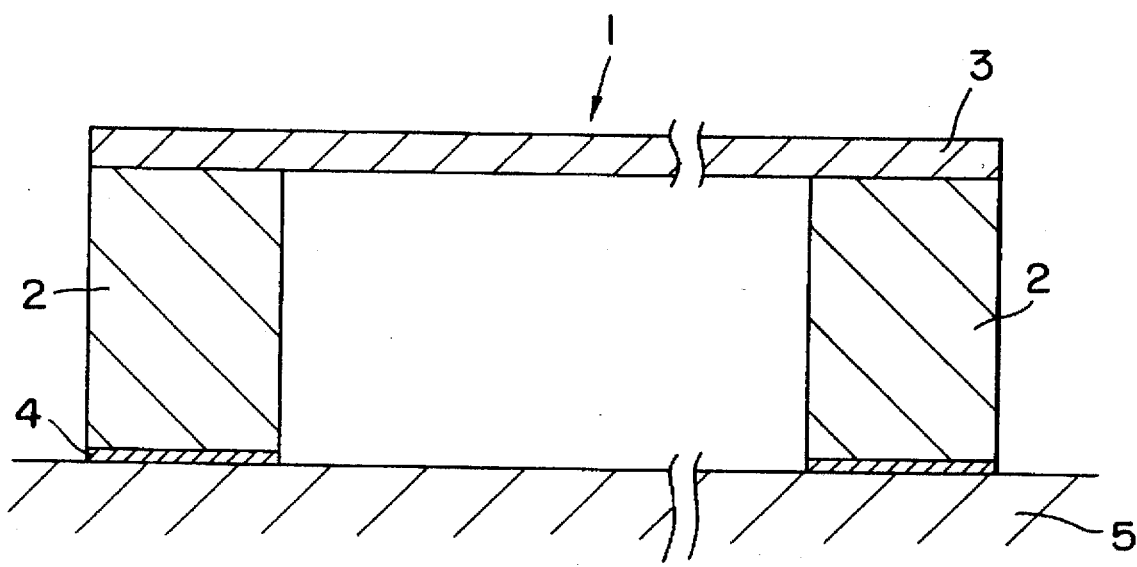
FIG. 1 is a sectional view showing an example of the dust protective member of the present invention.

The highly light-transmitting dust protective film of the present invention is characterized in that the film is composed of at least one member selected from the group consisting of transparent gels of oxides, hydroxides, organic group-containing oxides and organic group-containing hydroxides of polyvalent metals, formed by the sol-gel process. The sol-gel process is a forming process used for the formation of ceramics or the like, which utilizes the phenomenon that when a solution of a hydroxidizable organic metal compound such as a metal alkoxide is prepared, the organic metal compound in the solution undergoes hydrolysis, a sol in which the formed oxide or hydroxide is dispersed very finely in a colloidal particle size in the solvent (liquid medium) of the solution is formed by the hydrolysis, and the sol is converted to a gel by evaporation of the liquid medium or under heating.

Instead of the metal alkoxide, a hydrolyzable other organic metal compound, a metal nitrate and a metal chloride can be used as the starting compound for the sol-gel process. The colloidal particles of the metal oxide or metal hydroxide constituting the sol can be obtained not only by hydrolysis of a hydrolyzable organic metal compound, but also by flame hydrolysis of an organic metal compound or a metal chloride.

Since the dust protective film of the present invention has a gel structure in which colloidal particles of at least one member selected from the group consisting of transparent polyvalent metal oxides, hydroxides, organic group-containing oxides and organic group-containing hydroxides are agglomerated and solidified, the film has a very high light transmission, and moreover, the film is very stable against repeated irradiation with short-wavelength rays and the optical characteristics and mechanical characteristics of the film are not degraded by light irradiation, accumulation of heat or with the lapse of time.

If the sol-gel process is adopted for the formation of the gel film, an organic group not hydrolyzable can be included in an optional ratio in the hydrolyzable organic metal compound gel film. This organic group-included gel film is excellent in the pliability and toughness over the completely inorganic gel film, and is advantageous as the dust protective film in that the handling property and durability are excellent.

In the production of the dust protective film of the present invention, it is important that drying should be carried out at a temperature not higher than 500° C. In the present invention, even if a completely hydrolyzable organic metal compound such as tetraethoxysilane (ethyl silicate) is used, the obtained gel film has a high denseness and a flexibility or softness sufficient to resist peeling. This may give a strange feeling, but it is construed that in the gel film formed by the sol-gel process and dried at a temperature within the above-mentioned range, a small amount of the organic substance used as the solvent or dispersion medium is included in the gel structure and exerts a plasticizing action to the gel.

The highly light-transmitting dust protective film of the present invention and the dust protective member comprising this dust protective film spread on a holding frame will now be described with reference to the accompanying drawings.

FIG. 1 is a sectional view showing an example of the dust protective member of the present invention. Referring to FIG. 1, the dust protective member 1 comprises a highly light-transmitting dust protective film 3 spread on one side face of a holding frame 2, and the other side face is to be attached to a mask substrate 5 such as a mask or the like through a double-adhesive tape 4 or the like. The dust protective member 1 prevents adhesion of dust and the like to the mask substrate 5 at the step of producing semiconductor elements.

Figure 2A:
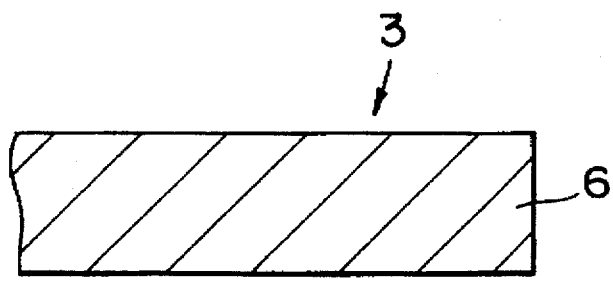
Figure 2B:
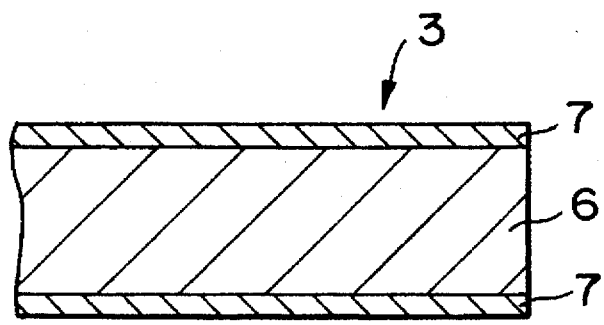
Figure 2C:
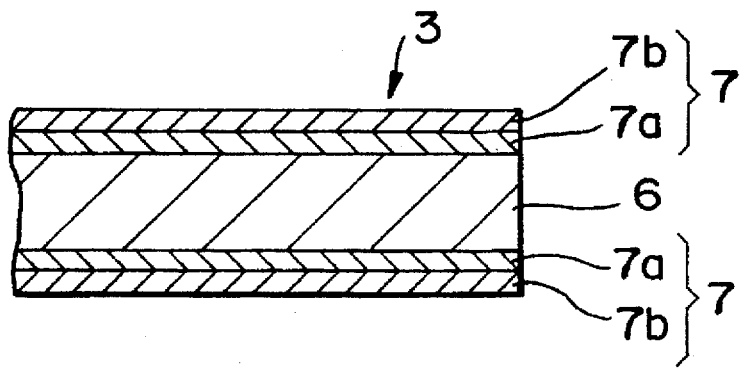

FIGS. 2A to 2C are sectional views illustrating a part of the highly light-transmitting dust protective film 3. In FIG. 2A, the highly light-transmitting dust protective film 3 is composed solely of a gel film 6 of a gel formed by the sol-gel process, and in FIGS. 2B and 2C, an antireflection layer 7 is laminated on the gel film 6. In FIG. 2B, the antireflection layer 7 is composed of a single layer, but in FIG. 2C, the antireflection layer 7 formed on the gel film 6 has a double-layer structure comprising a high refractive index layer 7a laminated on the gel film 6 and a low refractive index layer 7b laminated on the layer 7a.

The gel film 6 has a high light-transmitting property to not only g rays and i rays but also short wavelength rays such as excimer laser rays, and has no substantial light-absorbing property. Accordingly, photodisintegration is not caused even if light irradiation is conducted for a long time. Therefore, the light transmission and mechanical strength are not degraded. Furthermore, the gel film 6 has a good pliability and a high light transmission.

The thickness of the gel film 6 constituting the highly light-transmitting dust protective film 3 is preferably 0.2 to 10 μm, and the gel film 6 transmits rays having a wave number of 240 to 500 nm at an average light transmission of at least 85%.

The average light transmission referred to herein is a mean value of the valley and peak of an interference wave of the light transmission occurring between 240 nm and 500 nm.

The thickness of the gel film 6 is preferably smaller than the above-mentioned value of 10 μm, but if the thickness is smaller than 0.2 μm, a sufficient strength is not obtained in many cases. Of course, a thickness smaller than this value can be adopted if no problem arises with respect to the strength. A thickness larger than 10 μm can be adopted, but in view of the optical aberration at the light exposure, it is preferred that the thickness should not exceed 10 μm. Namely, if the film thickness exceeds 10 μm, at the light exposure using short wavelength rays such as excimer laser rays, the optical aberration is caused by this highly light-transmitting film, and it is apprehended that reproduction of a fine pattern on a semiconductor wafer will be hindered at the light exposure.

The thickness of the gel film 6 is selected so that a high transmission is attained for the wavelength used for the light exposure.

In the case where the highly light-transmitting dust protective film 3 is composed solely of the gel film as shown in FIG. 2A, the reflection is prevented and highest light transmission is attained when the following requirement is satisfied:

$$d_1 = \frac{m\lambda}{2n_1}$$

wherein $d_1$ represents the thickness of the gel film 6, $n_1$ represents the refractive index of the film 6, m is an integer of at least 1 and $\lambda$ represents the wavelength in use.

For example, in case of $n_1=1.3$, in order to increase the transmission of g rays (436 nm), the film thickness $d_1$ is adjusted 1.006 μm, and in order to increase the transmission of excimer laser rays (248 nm), the film thickness $d_1$ is adjusted to 0.954 μm.

In order to prevent reduction of the transmission caused when the gel film 6 having a desired thickness is not obtained, or in order to prevent fluctuation of the transmission by a change of the wavelength, an antireflection layer 7 is formed and laminated on the gel film 6, as shown in FIG. 2B or 2C. In this case, the transmission is hardly influenced by fluctuation of the thickness of the gel film 6 or the wavelength and a certain unevenness of the film thickness is allowed.

In the case where the antireflection layer 7 is composed of a single layer as shown in FIG. 2B, the reflection is prevented and a highest transmission is attained when the refractive index and the film thickness are selected so that requirements of (1) $\sqrt{n_1}=n_2$ and $$(2)\ d_2 = \frac{m\lambda}{4n_2}$$

are satisfied, in which $n_1$ represents the refractive index of the gel film 6, $n_2$ represents the refractive index in the wavelength to be used of the antireflection layer 7 and $d_2$ represents the thickness of the antireflection layer 7. The antireflection layer 7 can be laminated only on one surface of the gel film 6. In this case, the thickness of the film on one surface is designated as $d_2$.

The refractive index $n_1$ of the gel film 6 is ordinarily about 1.3 to about 1.6. Accordingly, it is sufficient if a substance having a refractive index $n_2=\sqrt{n_1}$ of about 1.14 to about 1.26 is laminated.

In the case where the antireflection layer 7 comprises a high refractive index layer 7a and a low refractive index layer 7b as shown in FIG. 2C, the reflection can be completely prevented and the transmission is increased when the refractive index and the film thickness are selected so that requirements of (1) $\sqrt{n_1}=n_2/n_3$, (2) $d_2=m\lambda/4n_2$ and (3) $d_3=m\lambda/4n_3$ are satisfied, in which $n_1$ represents the refractive index of the gel film 6, $n_2$ represents the refractive index in the wavelength to be used of the high refractive index layer 7a, $d_2$ represents the thickness of the layer 7a, $n_3$ represents the refractive index in the wavelength to be used of the low refractive index layer 7b and $d_3$ represents the thickness of the layer 7b. The high refractive index layer 7a and low refractive index layer 7b can be laminated only on one surface of the gel film 6. In this case, the thickness of the layers 7a and 7b on one surface are designated as $d_2$ and $d_3$, respectively.

In the present invention, the gel film 6 is composed of a gel of at least one member selected from the group consisting of the above-mentioned compounds (i) to (vi).

As the hydrolyzable monovalent group $R^1$ in the general formula (1), there can be mentioned alkoxy groups having up to 4 carbon atoms, such as a methoxy group, an ethoxy group, a propoxy group and an butoxy group, and acyloxy groups having 3 to 17 carbon atoms, such as an oxyacetic group and an octyloxy group.

As preferred examples of the compound of the general formula (1), there can be mentioned alkoxides such as tetramethoxysilane [$Si(OCH_3)_4$], tetraethoxysilane [$Si(OC_2H_5)_4$], aluminum isopropoxide $\{Al[OCH(CH_3)_2]_3\}$, titanium isopropoxide $\{Ti[OCH(CH_3)_2]_4\}$ and zirconium propoxide [$Zr(OC_3H_7)_4$], and metal salts of organic acids such as silicon octylate [$Si(C_7H_{15}COO)_4$] and aluminum octylate [$Al(C_7H_{15}COO)_3$]. As the nitrate, there can be mentioned aluminum nitrate [$Al(NO_3)_3$], zirconium nitrate [$Zr(NO_3)_4$] and titanium nitrate [$Ti(NO_3)_4$]. As the chloride, there can be mentioned aluminum chloride ($AlCl_3$), titanium tetrachloride ($TiCl_4$), zirconium chloride ($ZrCl_4$) and silicon tetrachloride ($SiCl_4$).

As the fine, particulate metal oxide or metal hydroxide, there can be mentioned silicon dioxide ($SiO_2$) obtained by hydrolyzing a vapor of silicon tetrachloride ($SICl_4$) in an oxyhydrogen flame, and aluminum hydroxide obtained by hydrolyzing aluminum isopropoxide $\{Al[OCH(CH_3)_2]_3\}$ in an aqueous solution. It is preferred that the particle size of the fine particles of the metal oxide or metal hydroxide be smaller than 0.2 µm, especially smaller than 0.05 µm. However, compounds that can be used are not limited to the compounds exemplified above.

In the general formula (2), the hydrolyzable group $R^1$ is as exemplified above, and the group R is an organic group directly bonded to the metal atom, which is not hydrolyzed but is left in the gel film. For example, there can be mentioned alkyl groups having up to 18 carbon atoms, such as a methyl group, an ethyl group and a butyl group, alkenyl groups having 2 to 6 carbon atoms, such as a vinyl group and an allyl group, cycloalkyl groups having 6 to 10 carbon atoms, such as a cyclohexyl group, and aryl groups having 6 to 10 carbon atoms, such as a phenyl group, a tolyl group, an ethylphenyl group and a naphthyl group. These hydrocarbon groups may be substituted with a halogen atom such as fluorine or chlorine, an alkoxy group, or a perfluoroalkoxy group or a perfluoroalkyl group.

As preferred examples of the compound of the general formula (2), there can be mentioned monomethyltriethoxysilane, dimethyldiethoxysilane, monoethyltriethoxysilane, monopropyltriethoxysilane, diphenyldiethoxysilane, and vinyltriethoxysilane.

Figure 4:
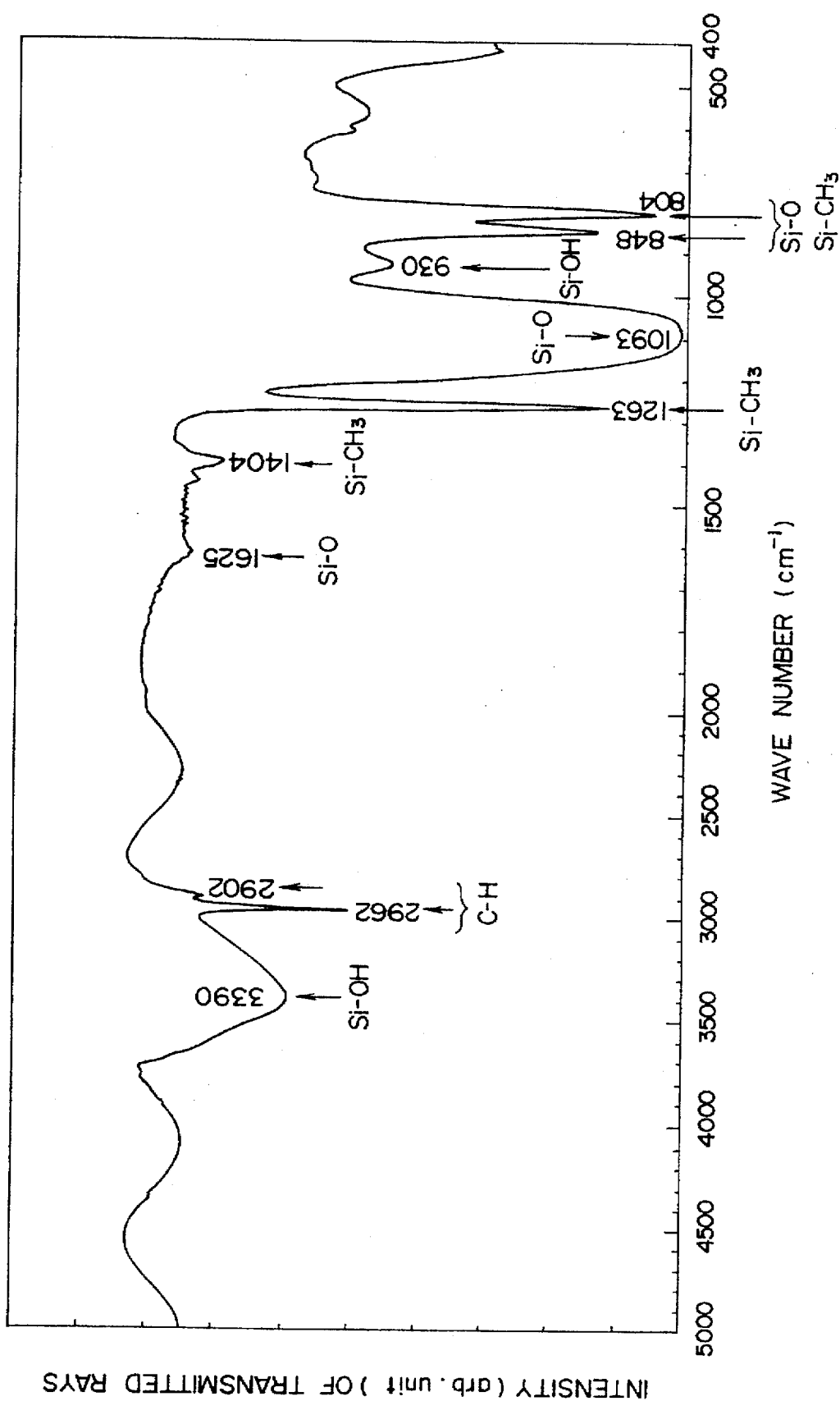
FIG. 4 shows the infrared absorption spectrum of the gel film of Example 1.

If the compound of the general formula (2) is used singly or in combination with the compound of the general formula (1), an organic group is included in the gel, and a gel film excellent in the pliability, strength and toughness can be obtained and this gel film is especially preferably used for attaining the objects of the present invention. For example, if a silane corresponding to the above-mentioned formula is used, a gel film having a siloxane group, a silanol group and an organosilyl group (≡Si—R), as is seen from the IR chart of FIG. 4, is formed.

Solvents and dispersion media customarily used for the sol-gel process can be used as the solvent or dispersion medium for the production of the sol, and use of a solvent having a boiling point higher than the boiling point of water is especially preferred. Either a single solvent or a mixture of two or more of solvents can be used. If a mixture comprising at least two solvents is used, it is especially preferred that at least one of the solvents used should have a boiling point higher than the boiling point of water.

As specific examples of the solvent, there can be mentioned alcohols such as tert-butanol, isopropanol, ethanol and methanol, amides such as formamide and dimethylformamide, aromatic hydrocarbons such as benzene, toluene and xylene, aliphatic hydrocarbons such as pentane, hexane, heptane and octane, glycols such as ethylene glycol, diethylene glycol and triethylene glycol, amines such as diethanolamine and triethanolamine, ethylene glycol monoether such as ethylene glycol monomethyl ether and ethylene glycol monoethyl ether, ketones such as acetone and methylethylketone, and β-diketones such as acetylacetone and benzoylacetone.

The amount used of the solvent is not particularly critical, but it is generally preferred that the solvent be used in an amount of 0.1 to 20 moles per mole of the metal constituting the gel film 6.

Water, a catalyst, a deflocculant and the like can be added for the preparation of the sol. Furthermore, an oxide, fluoride, chloride or nitride of an element of the group 1A, 2A, 3A, 4A, 2B, 3B, 4B, 5B or 6B of the periodic table can be incorporated.

In the case where water is added for the preparation of the sol, it is preferred that water be added in an amount of 0.1 to 20 moles per mole of the metal constituting the gel film 6.

As the catalyst, there can be mentioned, for example, hydrochloric acid, nitric acid, acetic acid, silicon tetrachloride, hydrofluoric acid, titanium tetrachloride, sodium hydroxide and aqueous ammonia. Preferably, the amount added of the catalyst is $1\times10^{-5}$ to 1 mole per mole of the metal constituting the gel film 6.

As the deflocculant, there can be mentioned, for example, hydrochloric acid, nitric acid, acetic acid, hydrofluoric acid, aqueous ammonia and polyvinyl alcohol. It is preferred that the deflocculant be added in an amount of up to 20% by weight based on the sol to be prepared.

For the production of the sol, there can be adopted a method in which a solvent is added to the starting material and the mixture is stirred at a temperature ranging from room temperature to the reflux temperature of the solvent, and a method in which a solvent is added to the starting material, the mixture is stirred at a temperature ranging from room temperature to the reflux temperature of the solvent, and the solvent is further added.

When water, the catalyst, the deflocculant or the like additive is added, the adding method is not particularly critical, but it is preferred that the additive be added to the solvent in advance and sufficiently mixed therewith.

Then, the sol prepared in the above-mentioned manner is formed into a film, and the film is converted to a gel, for example, by a method in which the sol is allowed to stand still and the solvent is evaporated, whereby a gel film is formed. Preferably, the viscosity of the sol to be formed into a gel film is adjusted by an evaporator or the like so that the film-forming operation can be easily performed.

For the formation of a film from the sol, there can be adopted (1) a method in which the sol is supplied to a clean and smooth substrate such as glass sheet, and the substrate is rotated and a film is formed by the rotational film-forming process, and (2) a method in which a substrate having a clean and smooth surface, such as a glass sheet, is immersed in the sol, the substrate is drawn up and a film is thus formed by the immersion process.

As the substrate used for the above-mentioned methods, there can be mentioned, for example, inorganic single crystal substrates such as a silicon wafer and a sapphire wafer, metal substrates such as aluminum and nickel, ceramic substrates such as aluminum oxide, magnesium oxide, silica glass and soda lime glass, organic substrates such as polypropylene, polystyrene, polycarbonate and an acrylic resin, substrates obtained by forming a metal film, a ceramic film or an organic film on the above-mentioned inorganic single crystal substrates, metal substrates, ceramic substrates and organic substrates by the CVD method, the spin coating method or the like, and the metal films such as an aluminum foil and organic films such as a nitrocellulose film, spread on a frame of a metal or the like.

The so-formed gel film is peeled from the substrate, whereby a single film is obtained. For peeling the gel film from the substrate, there can be adopted, for example, immersion in water or an organic solvent, mechanical peeling, etching of the substrate with an etching solution, dissolution of the substrate by a solvent or the like, and decomposition of the substrate by a heat treatment. In the case where a single film is obtained by immersion in water or an organic solvent, peeling can be facilitated by giving a vibration by an ultrasonic washing device or by maintaining the temperature of water or the organic solvent in a range of from room temperature to about 50° C.

According to another method for forming the sol into a, film, the sol is developed on the surface of a liquid having a larger specific gravity and a larger surface tension than those of the sol to obtain a film. As the liquid, there can be mentioned, for example, acetylene tetrabromide (CHBr$_2$CHBr$_2$). The formed film is scooped from the liquid surface, whereby a single film is obtained. The gel film on the substrate or single film formed is dried at a temperature of up to 500° C., preferably at a temperature ranging from 10° C. to 500° C. and being lower than the boiling point of the solvent used for the preparation of the sol, especially preferably at a temperature ranging from room temperature (25° C.) to 250° C. and being lower than the boiling point of the solvent used for the preparation of the sol, whereby a highly light-transmitting dust protective film is obtained. In the case where drying is carried out at the above-mentioned temperature, when the organic compound of the polyvalent metal is used as the starting material, the organic substance formed at the preparation of the sol is not completely converted to an inorganic substance. If drying is carried out at the above temperature, the solvent and/or the organic substance formed at the preparation of the sol is not completely removed from the gel but is left in the gel.

An antireflection layer 7 is laminated on the obtained gel film 6 according to need, and the highly light-transmitting dust protective film 3 is spread on a holding frame 2 composed of a metal, a ceramic material or a plastic material to complete a dust protective member 1.

As the material of the reflection-preventing layer 7, there can be mentioned a fluorine-containing polymer, preferably an amorphous fluorine-containing polymer, especially preferably a perfluoro amorphous resin. As the perfluoro amorphous resin, there can be mentioned homopolymers and copolymers comprising at least one kind of recurring units selected from the group consisting of recurring units represented by the following formulae [I] through [V], as disclosed in Japanese Unexamined Patent Publication No. 01-131214, Japanese Unexamined Patent Publication No. 01-131215, EP 303298A2 and EP 303292A2:

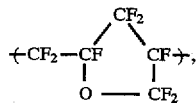
[I]

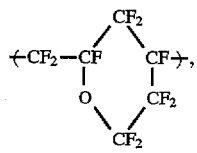
[II]

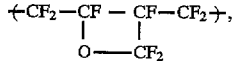
[III]

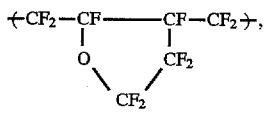
[IV]

and

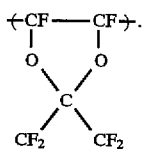
[V]

A copolymer comprising recurring units represented by the following formula [VI] in addition to the recurring units of the formulae [I] through [V] (disclosed, for example, in Japanese Examined Patent Publication No. 63-18964):

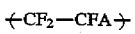
[VI]

wherein A represents a fluorine atom, —OCF$_2$CF$_2$CF$_3$ or —OCF$_3$CF(CF$_3$)OCF$_2$CF$_2$SO$_2$F is preferably used as the perfluoro amorphous resin.

As specific examples of the perfluoro amorphous resin, there can be mentioned a perfluoro-2,2-dimethyl-1,3-dioxole/tetrafluoroethylene copolymer, a homopolymer comprising recurring units [I], a homopolymer comprising recurring unit [II], a homopolymer comprising recurring units [III], a homopolymer comprising recurring units [IV], a homopolymer comprising recurring units [V], a copolymer comprising recurring units [I] and [II], a copolymer comprising recurring units [I] and [III], a copolymer comprising recurring units [I] and [IV], a copolymer comprising recurring units [I], [III] and IV, a copolymer comprising recurring units [I] and [VI] (in which A is a fluorine atom), a copolymer comprising recurring units [II] and [III], a copolymer comprising recurring units [II] and [IV], a copolymer comprising recurring units [II] and [VI] (in which A is a fluorine atom), a copolymer comprising recurring units [II], [IV] and [VI] [in which A is —OCF$_2$CF(CF$_3$)—OCF$_2$CF$_2$SO$_2$F], a copolymer comprising recurring units [I] and [VI] (in which A is —OCF$_2$CF$_2$CF$_3$), and the above-mentioned homopolymers and copolymers copolymerized with a derivative derived from starting CF$_2$=CFO (CF$_2$)$_n$CF=CF$_2$ (in which n is 1 or 2).

A copolymer comprising recurring units [I] through [VI], which is further copolymerized with other copolymerizable monomer so far as attainment of the objects of the present invention is not hindered, can be used as the perfluoro amorphous resin.

These perfluoro amorphous resins can be prepared, for, example, by radical polymerization of CF$_2$=CFO(CF$_2$)$_n$CF=CF$_2$ (in which n 1 or 2), perfluoro-2,2-dimethyl-1,3-dioxole, CF$_2$CFA (in which A is as defined above), and the like.

Commercially available products such as CYTOP® supplied by Asahi Glass, Teflon® AF1600 supplied by Du Pont and TeflonR AF2400 supplied by Du Pont can be used as the perfluoro amorphous fluorine resin.

Lamination of an antireflection layer composed of an amorphous fluorine-containing polymer as mentioned above is preferred because the light transmission is further improved. The thickness of the antireflection layer is generally 0.01 to 5.00 μm, preferably 0.02 to 2.00 μm.

According to the present invention, since a gel formed by the sol-gel process is used as the material for the dust protective film, a highly light-transmitting dust protective film having a good pliability and a high light transmission, which does not undergo photodisintegration even if the film is irradiated for a long time with not only g rays and i rays but also short wavelength rays such as excimer laser rays, can be obtained.

Furthermore, according to the present invention, this highly light-transmitting dust protective film can be prepared simply in a short time.

Moreover, according to the present invention, there is provided a dust protective member comprising a highly light-transmitting dust protective film having excellent properties as described above. More specifically, a dust protective member 1 comprises a highly light-transmitting dust protective film 3 spread on a holding frame 2, and the dust protective member 1 is attached to a mask substrate 5 such as a mask through a double-adhesive tape 4 or the like to prevent adhesion of a foreign substance such as dust at the light exposure. Since the gel film 6 is not photodistintegrated by short wavelength rays at the light exposure, the light transmission is high and the light exposure efficiency is increased.

EXAMPLES

The present invention will now be described in detail with reference to the following examples that by no means limit the scope of the invention.

Example 1

At room temperature, 0.5 mole of diethoxydimethylsilane $[(CH_3)_2Si(OC_2H_5)_2]$, 0.5 mole of tetraethoxysilane [Si $(OC_2H_5)_4$], 2.75 moles of water, 0.7 mole of isopropanol and 0.007 mole of hydrochloric acid were mixed for 2 hours, and the mixture was allowed to stand still at room temperature (25° C.) for 5 days to form a sol.

The sol was applied onto a substrate comprising a glass sheet and a nitrocellulose film having a thickness of 1 μm, formed on the glass sheet, by the rotational film-forming process (spin coating process) at 500 rpm for 60 seconds, whereby a gel film was formed on the substrate. The substrate with the gel film was placed in an oven maintained at 100° C. for 30 minutes and dried. The nitrocellulose film and gel film were together peeled from the glass sheet, and the nitrocellulose film was peeled from the gel film and a single film composed of the gel film was obtained.

Figure 3:
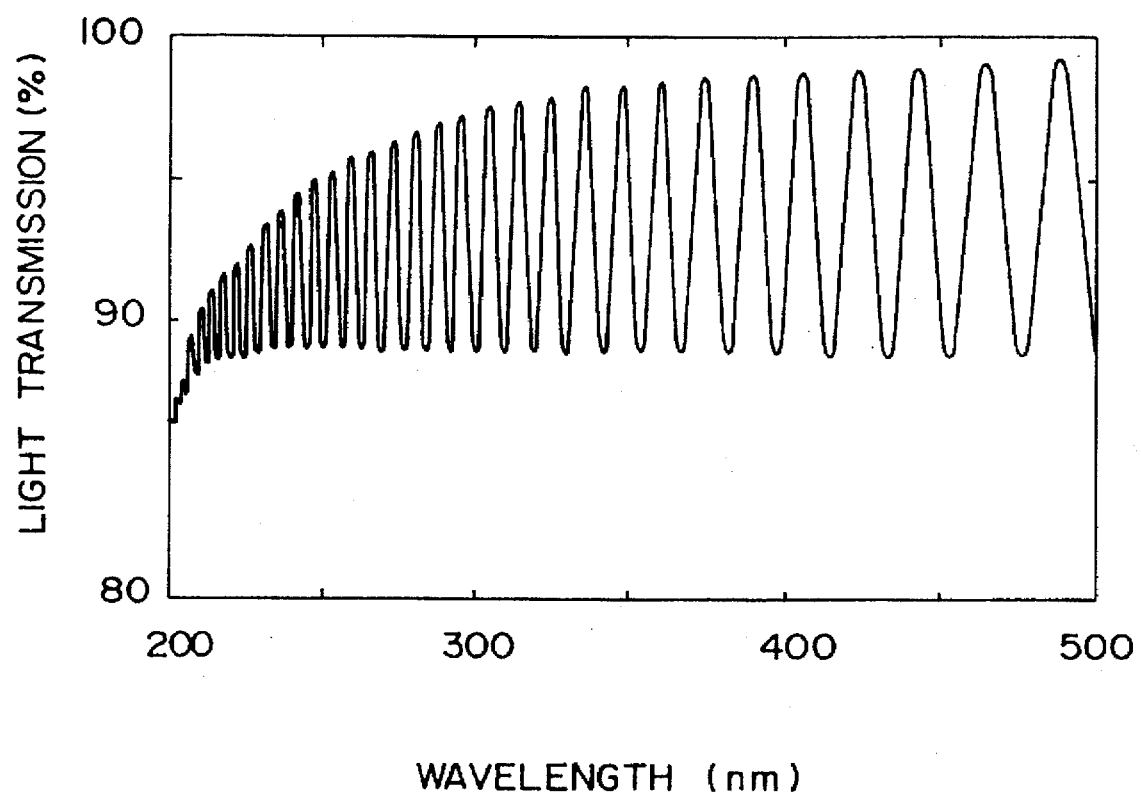
FIG. 3 is a graph showing the light transmission of the gel film of Example 1.

In the above-mentioned manner, a gel film having a thickness of 3.23 μm and a diameter of 80 mm, spread on a disk-shaped frame having a vacant space having a diameter of 60 mm at the center without any wrinkle, could be obtained. When the light transmission was measured within a range of from 500 nm to 200 nm, it was found that as shown in FIG. 3, the gel film showed a high light transmission to rays included within a broad range of the wavelength.

By conducting drying at a temperature lower than the decomposition temperature of the methyl group in the above-mentioned manner, a gel containing a silicon-methyl Si—CH$_3$ bond in addition to a silicon-oxygen three-dimensional Si—O bond and hence having a good pliability was formed. In order to examine the structure of the gel, the infrared transmission spectrum of the film was measured to obtain results shown in FIG. 4. From this spectrum, it was confirmed that the gel was composed mainly of Si—O, Si—CH$_3$ and Si—OH bonds. Accordingly, the film could be easily handled and a gel film having a relatively large area could be obtained as a single film. The average light transmission to rays having a wavelength of 350 to 450 nm of this gel film (having a thickness of 3.186 μm) was 93.6%.

For preventing the reflection of rays, a film of an amorphous resin (CYTOP® supplied by Asahi Glass) was spin-coated in a thickness of 0.073 μm on each surface of the gel film having a thickness of 3.186 μm, prepared from the above-mentioned sol, whereby the average light transmission to rays having a wavelength of 350 to 450 nm could be increased to 95.5% from 93.6%.

Comparative Example 1

A sol prepared from tetraethoxysilane, water, isopropanol and hydrochloric acid was spin-coated on various substrates to form square films having a side of at least 30 mm, and these films were converted to inorganic silica glass films by a heat treatment conducted at 800° C. Peeling of the formed films from the substrates was difficult, and cracks were formed and warping was caused in the films. Namely, a smooth single film having a thickness of 1 to 10 μm and a square shape of a side of at least 30 mm could not be prepared.

Example 2

At room temperature, 1.0 mole of tetraethoxysilane [Si $(OC_2H_5)_4$], 1.0 mole of water, 4.7 moles of isopropanol and 0.05 mole of nitric acid were mixed for 2 hours, and the majority of the solvent was evaporated at room temperature (25° C.) over a period of about 100 hours and concentration was conducted so that the viscosity of the sol was 5 cP. Then, 0.2 mole of N,N-dimethylformamide (hereafter referred to as "DMF") was added to the concentrated sol and mixing was carried out at room temperature for 2 hours.

The concentrated sol was applied onto a polystyrol substrate by the rotational film-forming process at 1000 rpm for 60 seconds to form a gel film, and the gel film was dried for 30 minutes in an oven maintained at 100° C., that is, a temperature lower than the boiling point (153° C.) of DMF. The obtained film was peeled as a single film from the substrate. This film had a thickness of 2.3 μm, and the light transmission at 248 nm was 80%.

Example 3

At room temperature (25° C.), 1.0 mole of tetraethoxysilane [Si(OC$_2$H$_5$)$_4$], 1.0 mole of water, 4.7 moles of isopropanol and 0.05 mole of nitric acid were mixed for 2 hours, and the majority of the solvent was evaporated at room temperature over a period of about 100 hours and concentration was conducted so that the viscosity of the sol was 5 cP.

Figure 5:
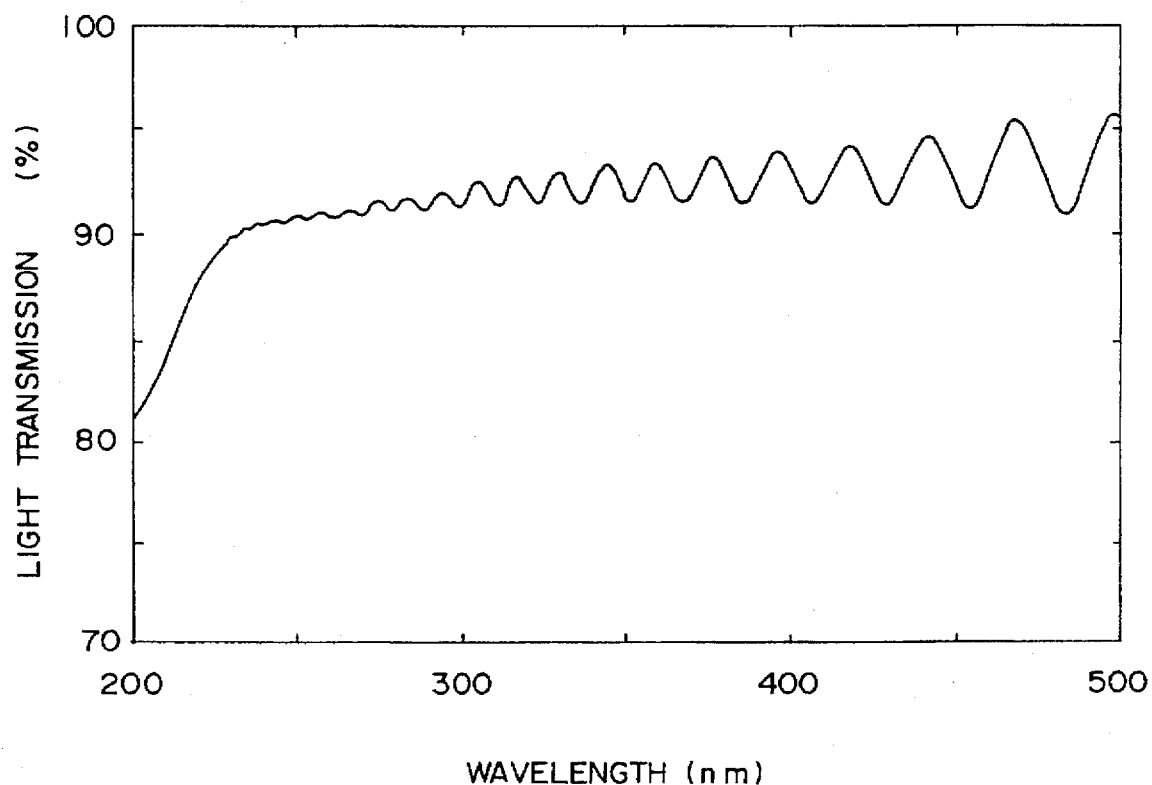
FIG. 5 is a graph showing the light transmission of the gel film of Example 3.

The concentrated sol was applied onto a polystyrene substrate by the rotational film-forming process at 1000 rpm for 60 seconds to form a gel film, and the gel film was dried for 30 minutes in an oven maintained at 100° C. The obtained film was peeled as a single film from the substrate. The film had a thickness of 2.1 μm. When the light transmission to rays of 500 to 200 nm was measured, it was confirmed that as shown in FIG. 5, the film had a high light transmission to rays included within a broad wavelength range.

We claim:

1. A light stable, pliable and highly light-transmitting dust protective film which is an independent film and is formed from a transparent gel prepared by the sol-gel process and consisting essentially of a compound selected from the group consisting of organic group-containing oxide of polyvalent metal and organic group-containing hydroxide of polyvalent metal, wherein the organic group-containing oxide of polyvalent metal or organic group-containing hydroxide of polyvalent metal has at least one hydrocarbon group bonded directly to the atom of polyvalent metal or has at least one substituted hydrocarbon group substituted, at least, with one member selected from the group consisting of fluorine, chlorine, alkoxy group, perfluoroalkoxy group and perfluoroalkyl group and said substituted hydrocarbon group is bonded directly to polyvalent metal with a carbon to metal bond and the polyvalent metal is selected from the group consisting of silicon, aluminum, titanium and zirconium and wherein the film has a thickness of about 1 to 10 μm and has an average light transmission of at least 85% of the light rays having a wave length of 240 to 500 nm, and an antireflection film laminated thereon.

2. A dust protective member comprising a highly light-transmitting dust protective film as set forth in claim 1 and a holding member integrated therewith.

3. A dust protective film as set forth in claim 1, wherein the antireflection film is composed of a perfluoro amorphous resin.

4. A dust protective film as set forth in claim 1 wherein said polyvalent metal is silicon.

5. A light stable, pliable and highly light-transmitting dust protective film which is an independent film formed from a transparent gel which consists essentially of a gel prepared by the sol-gel process from (i) a compound represented by the following formula:

$$R_n\text{—}Y\text{—}R^1_{k-n}$$

wherein R represents a monovalent hydrocarbon group or substituted hydrocarbon group, Y represents a metal atom selected from the group consisting of silicon, aluminum, titanium and zirconium, $R_1$ represents a hydrolyzable monovalent group, n is a number of 1 to k−1, and k represents the valency of the metal atom, or (ii) a combination of said compound with a compound represented by the following formula:

$$Y\text{—}R^1_k$$

wherein Y, $R^1$ and k are as defined above, and the film has a thickness of about 1 to 10 μm and has an average light transmission of at least 85% of the light rays having a wave length of 240 to 500 nm, and an anti-reflection film laminated thereon.

6. A dust protective film as set forth in claim 5, wherein the anti-reflective film is composed of a perfluoro amorphous resin.

* * * * *